US012709805B2

(12) United States Patent
Inoue et al.

(10) Patent No.: US 12,709,805 B2
(45) Date of Patent: Aug. 18, 2026

(54) TEMPERATURE CONTROL METHOD AND SUBSTRATE PROCESSING APPARATUS

(71) Applicant: Tokyo Electron Limited, Tokyo (JP)

(72) Inventors: Hisashi Inoue, Tokyo (JP); Tatsuya Yamaguchi, Yamanashi (JP); Noriaki Koyama, Tokyo (JP); Yuichi Takenaga, Yamanashi (JP); Tatsuya Watanabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 74 days.

(21) Appl. No.: 18/795,054

(22) Filed: Aug. 5, 2024

(65) Prior Publication Data

US 2025/0051922 A1 Feb. 13, 2025

(30) Foreign Application Priority Data

Aug. 9, 2023 (JP) ................................ 2023-129968

(51) Int. Cl.
*C23C 16/46* (2006.01)
*C23C 16/52* (2006.01)

(52) U.S. Cl.
CPC .............. *C23C 16/46* (2013.01); *C23C 16/52* (2013.01)

(58) Field of Classification Search
None
See application file for complete search history.

(56) References Cited

U.S. PATENT DOCUMENTS

2020/0101490 A1* 4/2020 Nozawa .................. B05D 1/60

FOREIGN PATENT DOCUMENTS

JP 2017-174983 A 9/2017

* cited by examiner

*Primary Examiner* — Michael G Miller
(74) *Attorney, Agent, or Firm* — Venjuris, P.C.

(57) ABSTRACT

A temperature control method includes providing a substrate processing apparatus including a processing container, and a heater that heats the processing container; setting an amount of temperature change with respect to a target temperature having a value up to a second digit smaller than a first digit indicating a control limit value of the heater; dividing the amount of temperature change into a first temperature equal to or greater than the first digit and a second temperature less than the first digit, and calculating a ratio of dividing a time segmented by a digit difference between the first digit and the second digit, into a first time corresponding to the second temperature and a second time other than the first time; and controlling the heater to raise or lower a temperature in times before and after dividing a processing time in a processing step at the ratio.

6 Claims, 7 Drawing Sheets

(a) BEFORE ADJUSTMENT
TARGET VALUE
TOP CTR4 CTR3 CTR2 CTR1 BTM
INTER-PLANE ADJUSTMENT IN INCREMENT OF 0.1°C
(b)
−0.2°C
TARGET VALUE
TOP CTR4 CTR3 CTR2 CTR1 BTM
INTER-PLANE ADJUSTMENT IN INCREMENT OF 0.01°C
(c)
−0.17°C
TARGET VALUE
TOP CTR4 CTR3 CTR2 CTR1 BTM

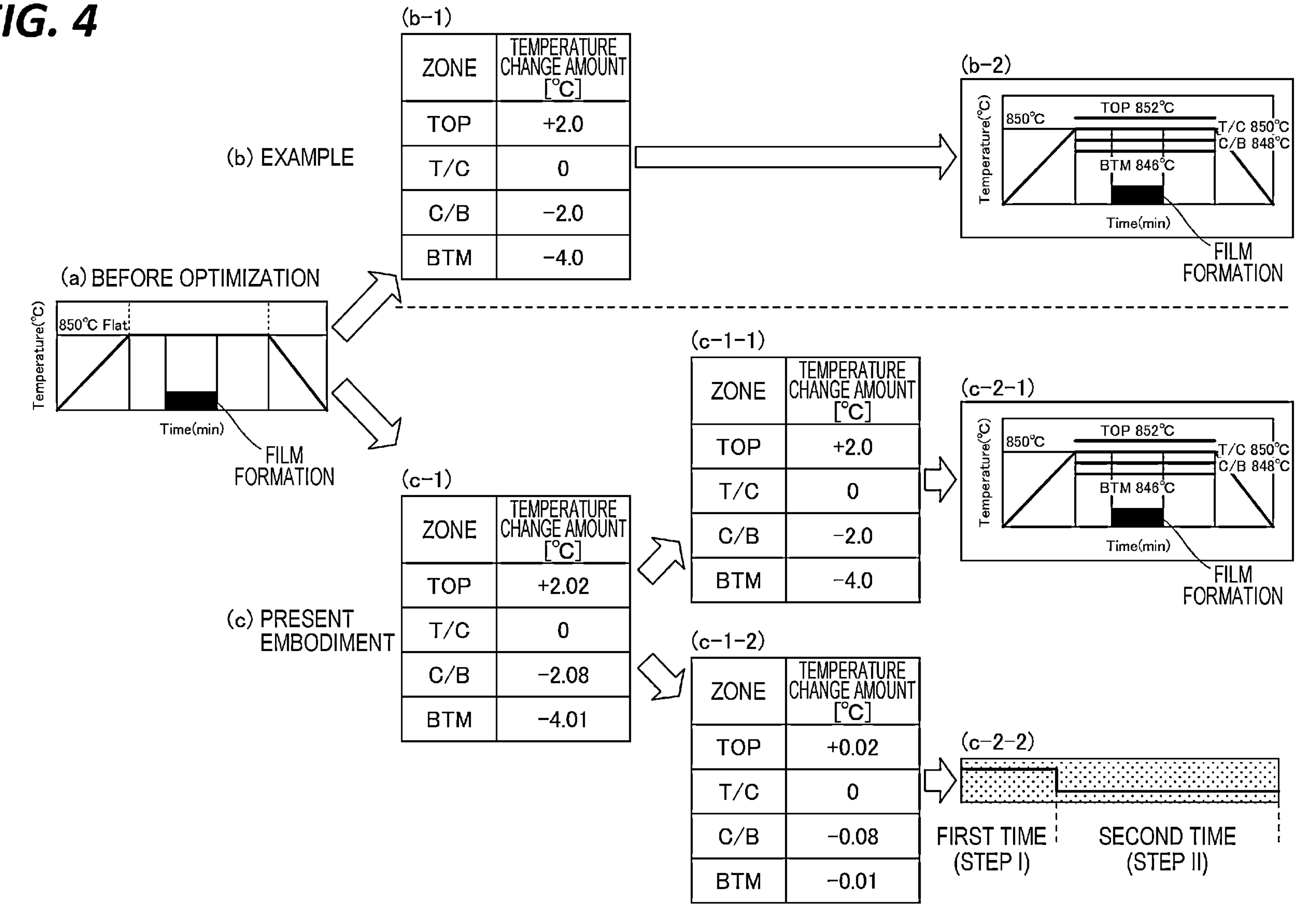
FIG. 4
(a) BEFORE OPTIMIZATION
Temperature(°C)
850°C Flat
Time(min)
FILM FORMATION
(b) EXAMPLE
(b-1)
ZONE
TEMPERATURE CHANGE AMOUNT [°C]
TOP +2.0
T/C 0
C/B -2.0
BTM -4.0
(b-2)
Temperature(°C)
850°C
TOP 852°C
T/C 850°C
C/B 848°C
BTM 846°C
Time(min)
FILM FORMATION
(c) PRESENT EMBODIMENT
(c-1)
ZONE
TEMPERATURE CHANGE AMOUNT [°C]
TOP +2.02
T/C 0
C/B -2.08
BTM -4.01
(c-1-1)
ZONE
TEMPERATURE CHANGE AMOUNT [°C]
TOP +2.0
T/C 0
C/B -2.0
BTM -4.0
(c-2-1)
Temperature(°C)
850°C
TOP 852°C
T/C 850°C
C/B 848°C
BTM 846°C
Time(min)
FILM FORMATION
(c-1-2)
ZONE
TEMPERATURE CHANGE AMOUNT [°C]
TOP +0.02
T/C 0
C/B -0.08
BTM -0.01
(c-2-2)
FIRST TIME (STEP I)
SECOND TIME (STEP II)

| ZONE | CHAGE AMOUNT BY ADJUSTMENT |
|---|---|
| TOP | 0.00 |
| CTR4 | −0.03 |
| CTR3 | 0.00 |
| CTR2 | 0.03 |
| CTR1 | −0.03 |
| BTM | 0.08 |

TEMPERATURE CONTROL METHOD AND SUBSTRATE PROCESSING APPARATUS

CROSS-REFERENCE TO RELATED APPLICATIONS

This application is based on and claims priority from Japanese Patent Application No. 2023-129968, filed on Aug. 9, 2023, with the Japan Patent Office, the disclosure of which is incorporated herein in its entirety by reference.

TECHNICAL FIELD

The present disclosure relates to a temperature control method and a substrate processing apparatus.

BACKGROUND

Japanese Patent Laid-Open Publication No. 2017-174983 proposes a film forming method of adjusting either a heater setting temperature or the number of ALD cycles through recipe optimization calculations.

SUMMARY

According to an aspect of the present disclosure, a temperature control method includes (a) providing a substrate processing apparatus including a processing container that accommodates a substrate, and a heater that heats an inside of the processing container; (b) setting an amount of temperature change with respect to a target temperature having a value up to a second digit smaller than a first digit indicating a control limit value of the heater; (c) dividing the amount of temperature change into a first temperature equal to or greater than the first digit and a second temperature less than the first digit, and calculating a ratio of dividing a time segmented by a digit difference between the first digit and the second digit, into a first time corresponding to the second temperature and a second time other than the first time; and (d) controlling the heater to raise or lower a temperature in times before and after dividing a processing time in a processing step at the ratio.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a conceptual diagram of a temperature control method according to an embodiment.

DETAILED DESCRIPTION

Figure 1:
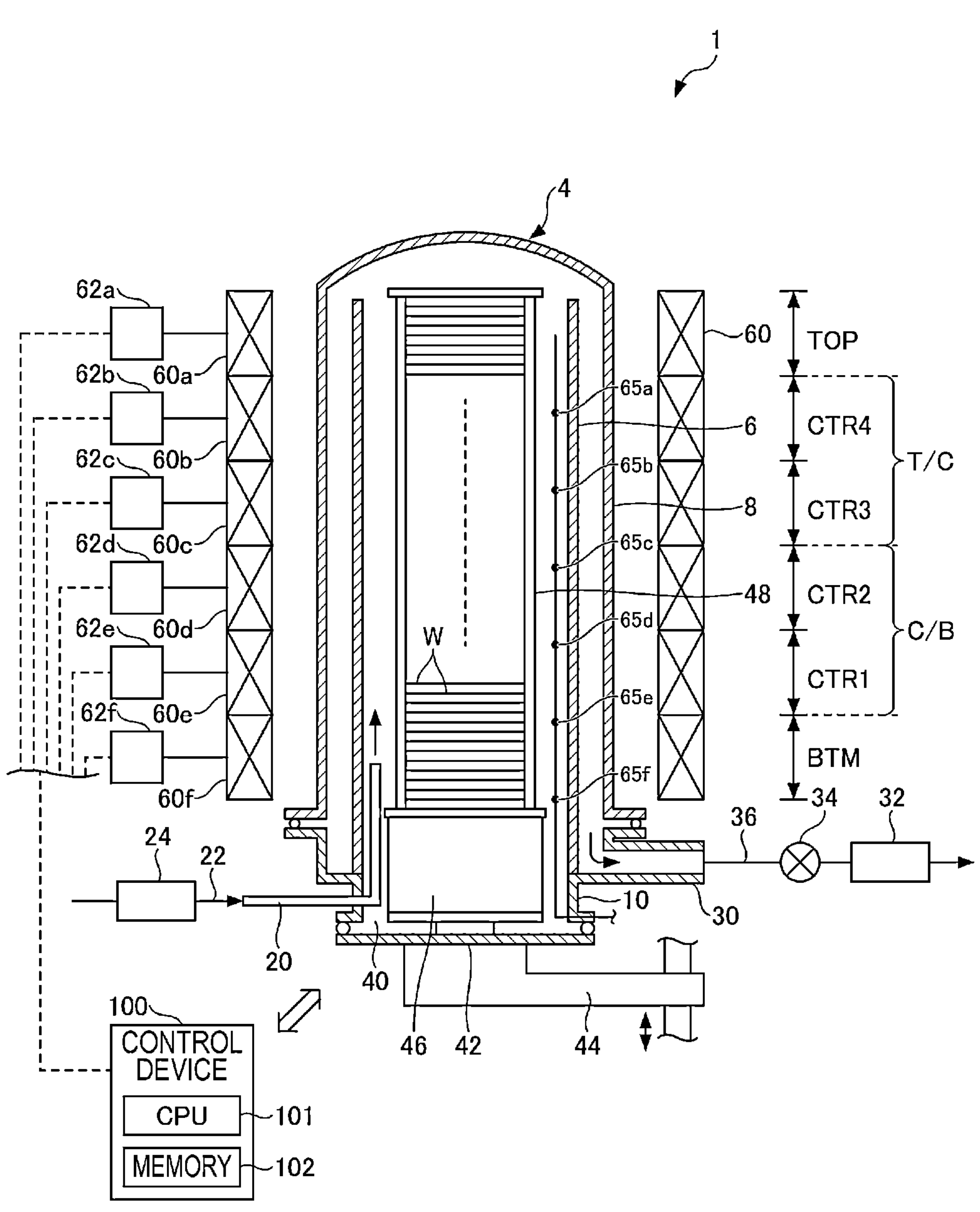
FIG. 1 is a cross-sectional schematic diagram illustrating an example of a substrate processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In each drawing, the same reference numerals may be given to the same components, and redundant descriptions may be omitted.

[Substrate Processing Apparatus]

FIG. 1 illustrates a substrate processing apparatus 1 according to an embodiment, which is capable of executing a substrate processing method to be described below. FIG. 1 is a cross-sectional schematic diagram illustrating an example of the substrate processing apparatus 1 according to an embodiment. The substrate processing apparatus 1 according to the present embodiment includes a substantially cylindrical processing container 4, with the longitudinal direction thereof oriented vertically. The processing container 4 has a double tube structure including an inner cylinder 6 in the form of a cylindrical body and an outer cylinder 8 including a ceiling which is concentrically arranged outside the inner cylinder 6. However, the substrate processing apparatus 1 may also have a single tube structure with a single cylindrical body. The inner cylinder 6 and the outer cylinder 8 are made of, for example, a heat-resistant material such as quartz. Substrate processing such as film formation is performed on a plurality of substrates W inside the processing container 4.

The inner cylinder 6 and the outer cylinder 8 are held at their respective lower ends by a manifold 10 made of, for example, stainless steel. The manifold 10 is fixed to abase plate (not illustrated), for example. Since the manifold 10 forms a substantially cylindrical internal space together with the inner cylinder 6 and the outer cylinder 8, the manifold is regarded as forming a part of the processing container 4.

The processing container 4 includes the inner cylinder 6 and the outer cylinder 8 made of, for example, a heat-resistant material such as quartz, and the manifold 10 made of, for example, stainless steel. The manifold 10 is provided at the lower side of a sidewall of the processing container 4 to hold the inner cylinder 6 and the outer cylinder 8 from below.

The manifold 10 includes a gas introducer 20 for introducing a process gas used for substrate processing into the processing container 4. FIG. 1 illustrates a form in which one gas introducer 20 is provided, but is not limited thereto, and a plurality of gas introducers 20 may be provided depending on the type of gas used and other factors.

The gas introducer 20 is connected to an introduction pipe 22 for introducing the process gas into the processing container 4. The introduction pipe 22 has a flow rate adjuster 24 such as a mass flow controller for adjusting the gas flow rate, and a valve (not illustrated) interposed therein.

Additionally, the manifold 10 includes a gas exhauster 30 for exhausting the interior of the processing container 4. An exhaust pipe 36 is connected to the gas exhauster 30 and includes a vacuum pump 32 capable of controlling a pressure reduction inside the processing container 4, a variable opening-degree valve 34, and the like.

A furnace opening 40 is formed at a lower end of the manifold 10, and a disc-shaped lid 42 made of, for example, stainless steel or similar materials is provided at the furnace opening 40. The lid 42 is provided, for example, to be vertically movable by a lifting mechanism 44 that functions as a boat elevator, and provides an airtight seal of the furnace opening 40.

A thermal insulation tube 46 made of, for example, quartz is installed above the lid 42. A wafer boat 48 made of, for example, quartz, is arranged above the thermal insulation tube 46 to hold, for example, approximately 50 to 200 substrates W horizontally at predetermined intervals in multiple stages. The plurality of substrates W arranged on the wafer boat 48 constitute a single batch, and various substrate processings may be performed thereon, on a batch-by-batch basis. An example of the substrate W may include a wafer with a diameter of 200 mm to 300 mm. The wafer boat 48 is an example of a boat that holds a plurality of substrates in a plurality of slots arranged vertically in multiple stages and that is loaded into and unloaded from the processing container 4.

The wafer boat 48 is loaded into the processing container 4 by raising the lid 42 using the lifting mechanism 44, and substrate processing is performed on the substrates W held inside the wafer boat 48. After the substrate processing is performed, the wafer boat 48 is unloaded from the processing container 4 to a lower loading area by lowering the lid 42 using the lifting mechanism 44.

A heater 60 having, for example, a cylindrical shape, is provided at the outer peripheral side of the processing container 4, and is capable of heating the processing container 4 to a predetermined temperature. The heater 60 is an example of a heater used to heat the interior of the processing container 4. The heater 60 includes a plurality of heaters 60*a* to 60*f* that adjust the temperature of the plurality of substrates W, which are accommodated inside the processing container 4 for each of a plurality of zones.

The heaters 60*a* to 60*f* are provided from top to bottom in the vertical direction. The heaters 60*a* to 60*f* are configured to enable the heater output value (e.g., power or heat generation amount) to be independently controlled by power controllers 62*a* to 62*f*, respectively. Further, temperature sensors 65*a* to 65*f* are installed in the interior of the inner cylinder 6 to correspond to the heaters 60*a* to 60*f*. The temperature sensors 65*a* to 65*f* are provided from top to bottom in the vertical direction of the inner cylinder 6. Examples of the temperature sensors 65*a* to 65*f* may include thermocouples and resistance temperature detectors. The temperature sensors 65*a* to 65*f* are also collectively referred to as "temperature sensor 65."

When dividing an area of the wafer boat 48, where the substrates are accommodated, into a plurality of zones, the heaters 60*a* to 60*f* are provided for each zone in a one-to-one correspondence. In the substrate processing apparatus 1, for example, the wafer boat 48 is divided into six zones. The six zones are referred to as "TOP," "CTR4," "CTR3," "CTR2," "CTR1," and "BTM" in order from top to bottom.

The heater 60*a* heats a plurality of substrates in the "TOP" zone. The temperature sensor 65*a* measures the temperature of the "TOP" zone inside the inner cylinder 6. Hereinafter, the temperature of each zone inside the inner cylinder 6 is also referred to as "zone temperature." The heater 60*b* heats a plurality of substrates in the "CTR4" zone. The temperature sensor 65*b* measures the temperature of the "CTR4" zone. The heater 60*c* heats a plurality of substrates in the "CTR3" zone. The temperature sensor 65*c* measures the temperature of the "CTR3" zone. The heater 60*d* heats a plurality of substrates in the "CTR2" zone. The temperature sensor 65*d* measures the temperature of the "CTR2" zone. The heater 60*e* heats a plurality of substrates in the "CTR1" zone. The temperature sensor 65*e* measures the temperature of the "CTR1" zone. The heater 60*f* heats a plurality of substrates in the "BTM" zone. The temperature sensor 65*f* measures the temperature of the "BTM" zone.

A control device 100 controls an overall operation of the substrate processing apparatus 1. The control device 100 includes a central processing unit (CPU) 101 and a memory 102. The CPU 101 is a computer for controlling the overall operation of the substrate processing apparatus 1.

The memory 102 stores a control program for realizing the substrate processing executed in the substrate processing apparatus 1 under the control of the control device 100 and a recipe that sets a substrate processing procedure and the like for each step. Further, the memory 102 stores various programs for causing each component of the substrate processing apparatus 1 to execute the substrate processing according to a process condition set in the recipe. These various programs may be stored in storage media and then stored in the memory 102. Examples of the storage media may include hard disks, semiconductor memories, and portable media such as CD-ROMs, DVDs, and flash memories. Further, these programs, parameters, and various data may be transmitted appropriately to the memory 102 from other devices or host computers via wired or wireless communication methods. The control device 100 may be a control device provided separately from the substrate processing apparatus 1. Further, the memory 102 may be a storage device provided separately from the substrate processing apparatus 1.

The temperature sensors 65*a* to 65*f* transmit detection signals to the control device 100. The control device 100 calculates setting values for the power controllers 62*a* to 62*f* based on the detection signals from the temperature sensors 65*a* to 65*f*, and outputs the calculated setting values to the respective power controllers 62*a* to 62*f*. This enables the independent control of output values (e.g., power) for the heaters 60*a* to 60*f*.

[Temperature Control]

In the substrate processing apparatus 1, the inter-plane uniformity of the film thickness of the substrate W from the "TOP" zone to the "BTM" zone is adjusted by changing the temperature for each zone. An optimal temperature combination for each zone to improve the inter-plane uniformity is sometimes calculated using optimization software (e.g., optimization models).

The adjustment of the inter-plane uniformity of the film thickness is performed within the range of temperature control resolution. Thus, the inter-plane uniformity of the film thickness may be improved only within the range in which it may be adjusted by the control limit (temperature control resolution) of the heater 60. The adjustment of the inter-plane uniformity of the film thickness has been carried out in increments of 0.1° C., which is the temperature control resolution of the substrate processing apparatus 1. In this case, the range in which the inter-plane uniformity of the film thickness may be adjusted in increments of 0.1° C. is the limit to which the inter-plane uniformity may be improved.

Recently, with the progress of semiconductor miniaturization and increased customer demands for finer miniaturization, it is assumed that there are cases where customer demands for finer miniaturization may not be satisfied within the aforementioned limit of temperature control resolution, depending on the required degree of uniformity.

Figure 2:
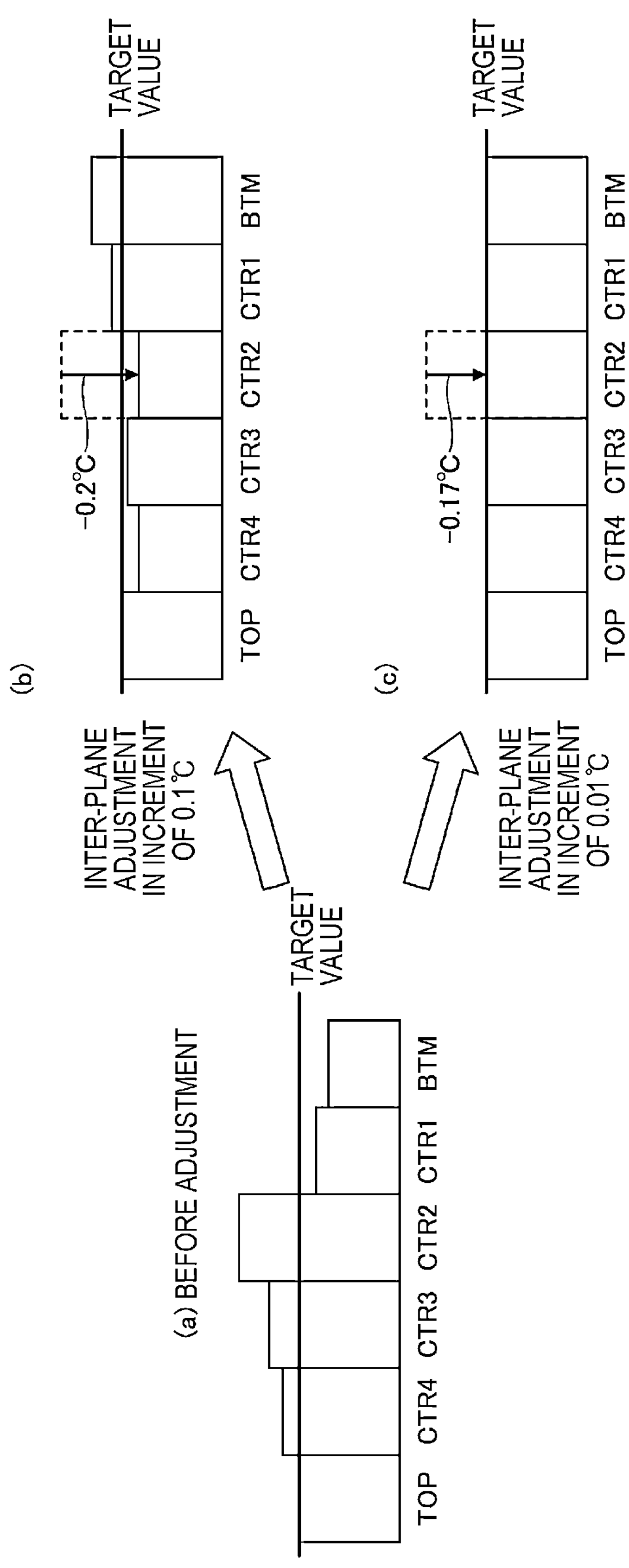
FIG. 2 is a diagram illustrating the film thickness distribution and the control limit (temperature control resolution) of a heater.

For example, referring to FIG. 2 illustrating the film thickness distribution and the control limit (temperature control resolution) of the heater 60, part (a) of FIG. 2 illustrates an example of a film thickness result from film formation when all zones are controlled at the same target temperature. Despite controlling all of the zones at the same temperature, the film thickness of each zone does not match a target value, resulting in deviations between zones. Therefore, in parts (b) and (c) of FIG. 2, the target temperature for each zone is changed individually, and the heaters 60*a* to 60*f* are controlled to achieve each target temperature for each zone, which brings the film thickness for each zone closer to or matching the target value. Since the deviation of the film thickness from the target value is controlled by temperature adjustments in this way, the range in which the film thickness changes with temperature control resolution serves as the limit for the temperature adjustment. Part (b) of FIG. 2 illustrates a film formation result when the temperature is adjusted in increments of 0.1° C., which is the minimum digit of the control limit of the heaters 60*a* to 60*f*. Part (c) of FIG. 2 illustrates a film formation result when the temperature is adjusted in increments of 0.01° C. The temperature adjustments during film formation in part (c) of FIG. 2 are carried out with higher temperature control resolution compared to the temperature adjustment during film formation in part (b) of FIG. 2. Therefore, the film formation result illustrated in part (c) of FIG. 2 allows for more precise adjustments of the film thickness, as compared to the film formation result illustrated in part (b) of FIG. 2, thereby bringing the film thickness of each zone closer to or matching the target value.

For example, since the temperature control in part (b) of FIG. 2 is in increments of 0.1° C., the adjustment of the film thickness is made by subtracting 0.2° C. from the current temperature value even if controlling the heater 60 by subtracting 0.17° C. from the current temperature value of "CTR2" would match the film thickness to the target value. This results in the film thickness not matching the target value and deviating slightly from the target value. Meanwhile, the temperature control in part (c) of FIG. 2 is in increments of 0.01° C., allowing for the control of the heater 60 by subtracting 0.17° C. from the current temperature value of "CTR2" and thus matching the film thickness to the target value.

Therefore, in the processing (film formation) step by the substrate processing apparatus 1, the temperature of each zone is changed in a pulse-like manner and the times before and after the change are divided proportionally, so that the temperature control resolution is made finer than the control limit value ((minimum control limit value) of the heater, enabling higher resolution temperature control. This typically improves the inter-plane uniformity of the film thickness without changing the hardware configuration of the substrate processing apparatus 1.

Figure 3:
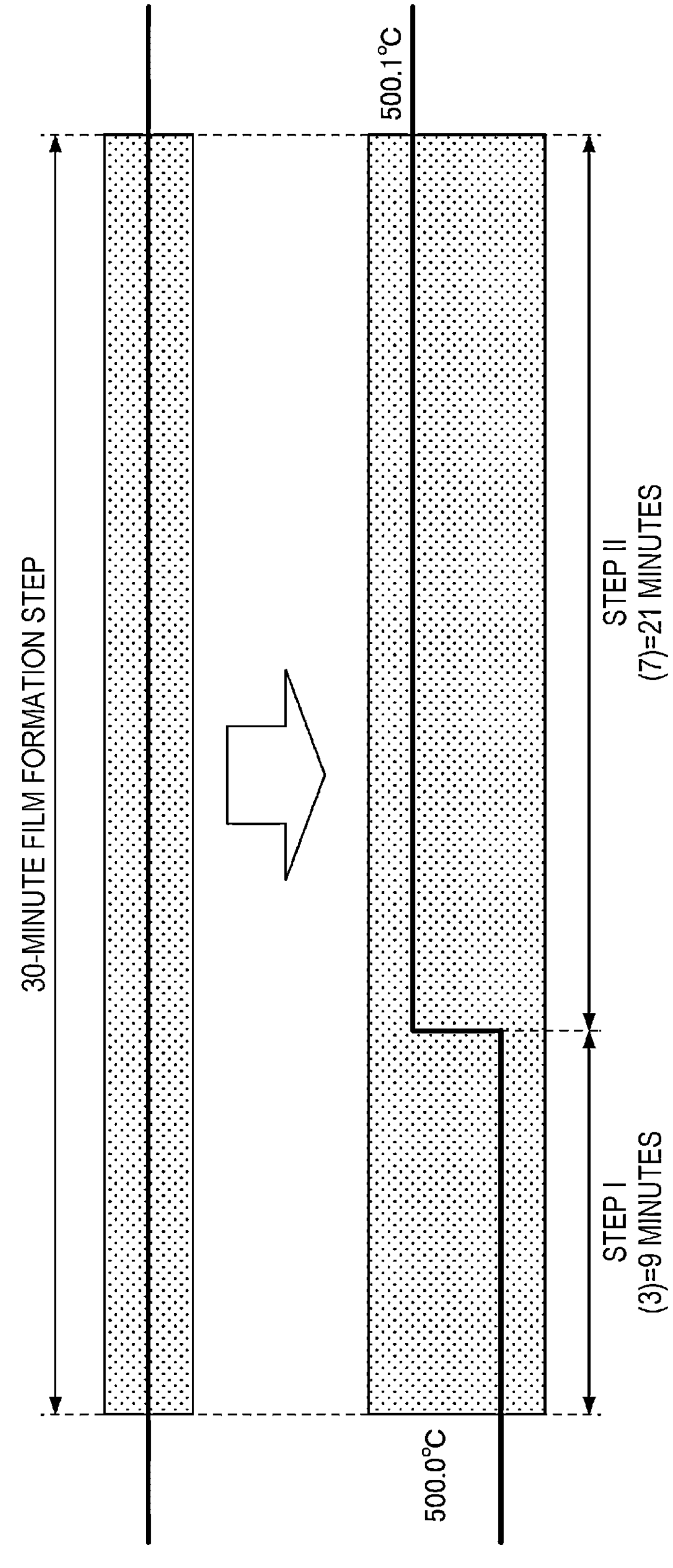
FIG. 3 is a diagram illustrating an example of temperature control performed with finer precision than the control limit according to an embodiment.

FIG. 3 is a diagram illustrating an example of temperature control performed with finer precision than the control limit of the heater 60 according to an embodiment. For example, if it is desired to control a 30-minute film formation step to achieve a target temperature of 500.07° C., the film formation step is divided into two steps with setting temperatures of 500.0° C. and 500.1° C. The time ratio of the respective steps is set to 3:7=9 minutes: 21 minutes in the recipe. Then, the heater 60 is controlled based on the recipe to 500.0° C. for 9 minutes in Step I and to 500.1° C. for 21 minutes in Step II during the 30-minute film formation step. This allows the heater 60 to be controlled to the substrate target temperature of 500.07° C. during the film formation step.

As a result, the temperature may be controlled with a control resolution in increments of 0.01° C. or finer (e.g., increments of 0.001° C.) while maintaining a temperature control structure in which the control limit value of the heater 60 is in increments of 0.1° C., without changing the hardware configuration of the substrate processing apparatus 1.

FIG. 4 is a conceptual diagram of a temperature control method according to an embodiment. For a pre-optimization target temperature in part (a) of FIG. 4, in a temperature control method according to an example illustrated in part (b) of FIG. 4, an optimal temperature change amount from the "TOP" zone to the "BTM" zone is calculated using optimization software and is added to the target temperature of each zone for optimization. In a temperature control method according to the present embodiment illustrated in part (c) of FIG. 4, temperature optimization for each zone is carried out in the same way as in the example for the pre-optimization target temperature in part (a) of FIG. 4. Along with this, the temperature change timing (e.g., 9 minutes and 21 minutes) for the temperatures (500.0° C. and 500.1° C.) as exemplified in FIG. 3 is calculated.

Specifically, the target temperature is first calculated to any digit. In part (a) of FIG. 4, 850° C. is calculated as the target temperature for all zones. While part (a) of FIG. 4 illustrates a film formation step as an example, the same temperature control is possible in other substrate processing steps.

The calculation of the optimal temperature change amount for the target temperature in parts (b-1) and (c-1) of FIG. 4 is optimized using a quadratic programming method. The digit of the temperature calculated here may be determined by the user. In the example, the calculated optimal temperature is rounded to the first decimal place of the control limit value of the heater 60 and is notified to the user. In the present embodiment, rounding is performed to the number of decimal places set by the user. The quadratic programming method is a method for calculating an optimal condition. The quadratic programming method according to the present embodiment uses an optimization model (optimization software) to calculate a combination of optimal temperature change amounts for each zone that reduces the gap with the pre-optimization target temperature. The optimization model defines an amount that the substrate temperature changes if the "TOP" temperature is increased by 1° C. and how much the film thickness changes if the substrate temperature is increased by 1° C., among other factors.

In the example, as illustrated in part (b-1) of FIG. 4, a temperature change amount for each zone from "TOP" to "BTM" is calculated. Then, as illustrated in part (b-2) of FIG. 4, the heater 60 in each zone is independently controlled to achieve a value obtained by adding the temperature change amount to the pre-optimization target temperature. Thus, "TOP" is controlled to 852° C. based on a temperature change amount of 2° C., "T/C" is controlled to 850° C. based on a temperature change amount of 0° C., "C/B" is controlled to 848° C. based on a temperature change amount of −2° C., and "BTM" is controlled to 846° C. based on a temperature change amount of −4° C. In addition, "T/C" collectively refers to the "CTR4" and "CTR3" zones, and "C/B" collectively refers to the "CTR2" and "CTR1" zones.

In the present embodiment, as illustrated in part (c-1) of FIG. 4, a temperature change amount for each zone from "TOP" to "BTM" is calculated in increments determined by the user (here, increments of 0.01° C. (the second decimal place)). The temperature change amount illustrated in part (c-1) of FIG. 4 is divided into the numerical value to the first decimal place illustrated in part (c-1-1) of FIG. 4 and the numerical value to the second decimal place illustrated in part (c-1-2) of FIG. 4. The value of the first decimal place is the control limit value of the heater 60, and the digit of the control limit value is the minimum control limit digit of the heater 60. The numerical value illustrated in part (c-1-2) of FIG. 4 is represented to the second decimal place, and the numerical value to the second decimal place exceeds the control limit of the heater 60.

For the numerical value to the first decimal place as illustrated in part (c-1-1) of FIG. 4, similarly to the example, the heater 60 in each zone is independently controlled to achieve a value obtained by adding the temperature change amount to the pre-optimization target temperature, as illustrated in part (c-2-1) of FIG. 4. Thus, “TOP” is controlled to 852° C. based on a temperature change amount of 2° C., “T/C” is controlled to 850° C. based on a temperature change amount of 0° C., “C/B” is controlled to 848° C. based on a temperature change amount of −2° C., and “BTM” is controlled to 846° C. based on a temperature change amount of −4° C.

Simultaneously with this control, a pulse output is generated according to the temperature change timing (see, e.g., part (c-2-2) of FIG. 4). For example, “TOP” is divided into two steps with setting temperature of 852.00° C. and 852.10° C. The time ratio of the respective steps is set to 2:8 in the recipe. Then, the heater 60 is controlled based on the recipe to 852.00° C. for a first time in Step I and to 852.10° C. for a second time in Step II during the film formation step. This allows the heater 60 to be controlled to the substrate target temperature of 852.02° C. during the film formation step. Thus, “TOP” is controlled to 852° C.+0.02° C. Other zones are controlled similarly. This enables finer and more precise temperature control than that of the control limit value of the heater 60 (here, the first decimal place) in each zone.

The numerical value to the first decimal place, which is the control limit value of the heater 60, is notified to the user as the setting temperature for the substrate processing apparatus 1. The numerical value to the second decimal place or beyond, which exceeds the control limit value of the heater 60, is notified to the user through calculation of the temperature change timing using the temperature control method described with reference to FIG. 3. The user sets a post-optimization temperature based on the notified temperature change amount and the pulse-like temperature change timing in the recipe. Alternatively, the post-optimization temperature based on the notified temperature change amount and the pulse-like temperature change timing may be automatically set in the recipe. The control device 100 executes the film formation step according to the recipe.

Figure 5:
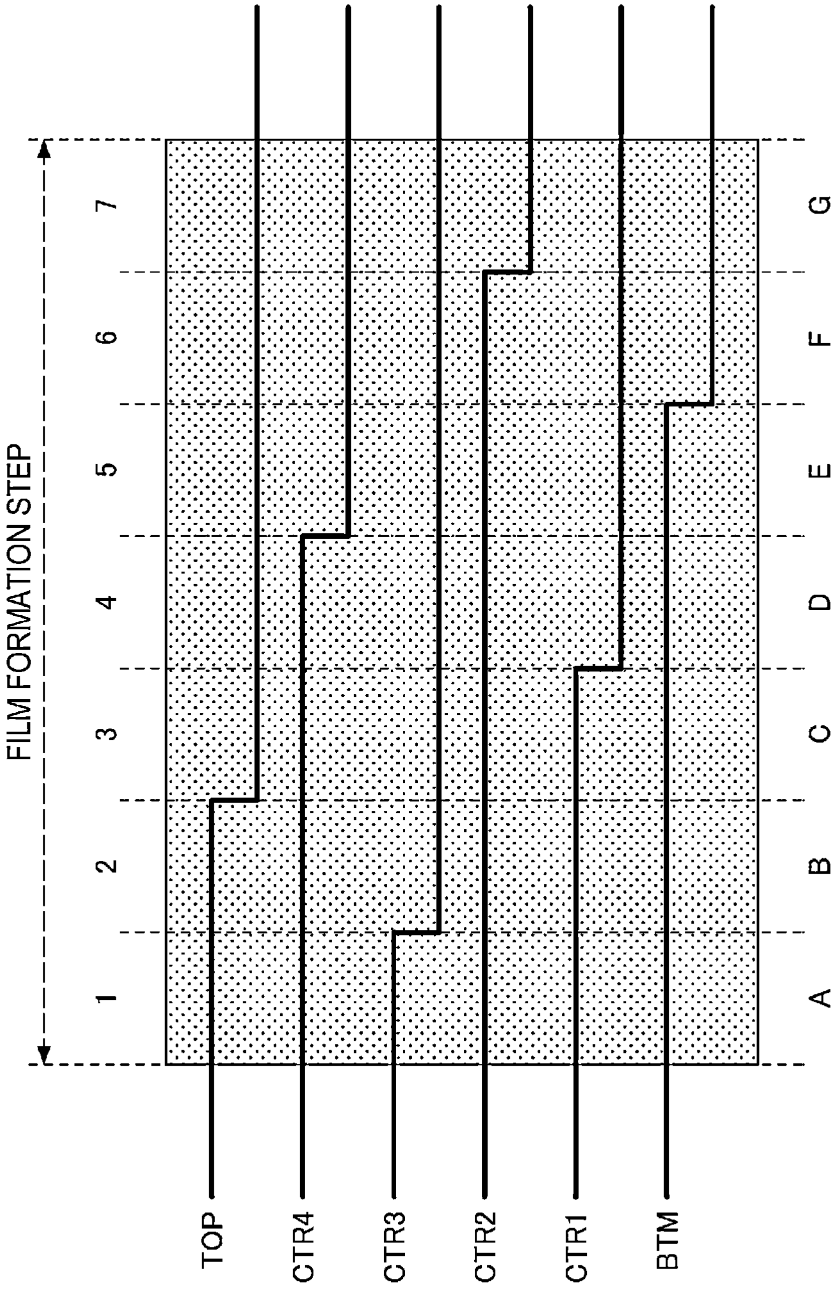
FIG. 5 is an explanatory diagram of a temperature control method according to an embodiment.

In the manual or automatic settings for the recipe, the film formation step is divided into (number of zones+1) steps so that the temperature change amount may be controlled at a separate timing for each zone. FIG. 5 is an explanatory diagram of a temperature control method according to an embodiment. For example, in the temperature control method of FIG. 5, since the timing of the temperature change for each zone is different, the film formation step is divided into 7 steps (6 zones from “TOP” to “BTM”+1). This enables temperature change for each zone. While respective times A to G are illustrated equally in FIG. 5, the times may be changed according to the pulse-like temperature change timing for each zone.

[Temperature Control Method]

Figure 6:
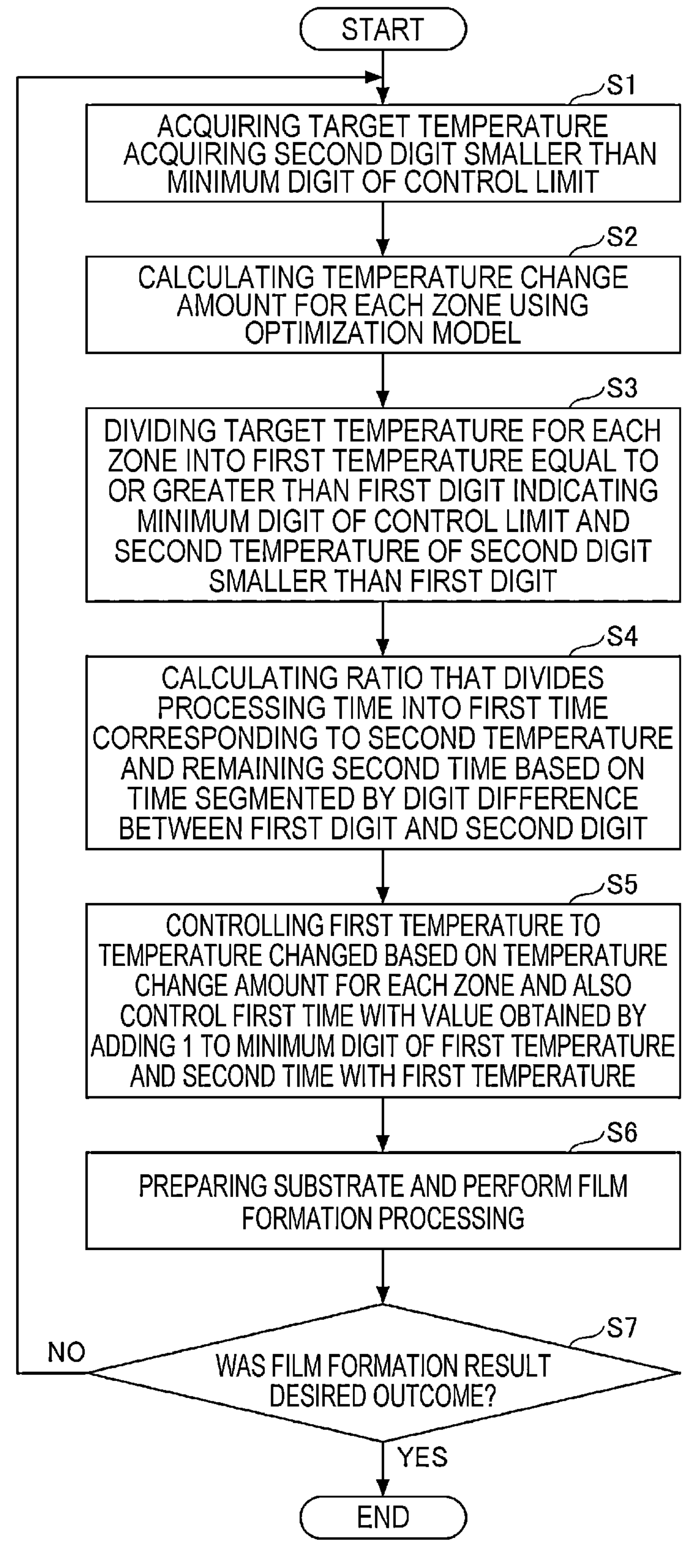
FIG. 6 is a flowchart illustrating an example of a temperature control method according to an embodiment.

A temperature control method according to an embodiment will be described with reference to the flowchart of FIG. 6. FIG. 6 illustrates an example of a temperature control method according to the embodiment. The temperature control method according to the present embodiment is controlled by the control device 100 and is executed by the substrate processing apparatus 1.

In step S1, the control device 100 acquires a target temperature. In the example of part (a) of FIG. 4, 850° C. is obtained as the target temperature for each step of the film formation step. Further, the control device 100 acquires the second digit, which is smaller than the first digit indicating the minimum digit of the temperature control limit. The second digit is determined in advance by the user.

Next, in step S2, the control device 100 uses an optimization model (optimization software) to calculate a temperature change amount for each zone. In the example of part (c-1) of FIG. 4, the temperature change amount is calculated for each zone.

Next, in step S3, the control device 100 divides the target temperature for each zone into a first temperature, which is represented as equal to or greater than the first digit indicating the minimum digit of the control limit of the heater 60, and a second temperature, which is represented as the second digit smaller than the first digit. In the example of part (c-1) of FIG. 4, the numerical value to the first decimal place illustrated in part (c-1-1) of FIG. 4 is taken as the first temperature. The numerical value to the second digit (second decimal place) smaller than the first digit illustrated in part (c-1-2) of FIG. 4 is taken as the second temperature.

Next, in step S4, the control device 100 calculates a ratio that divides the film formation time into a first time corresponding to the second temperature and the remaining second time based on a time segmented by the digit difference between the first digit and the second digit.

In the example of part (c-1) of FIG. 4, the first digit corresponds to the first decimal place and the second digit corresponds to the second decimal place. For the second temperature of “0.02° C.,” which is the temperature change amount of the “TOP” zone illustrated in part (c-1-2) of FIG. 4, a time segmented by 1/10, which is the digit difference between the first digit and the second digit, is set to two levels of pulses corresponding to the second temperature of 0.02° C. Here, the film formation time is divided into the first time (2/10), corresponding to the second temperature of “0.02° C.” and the remaining second time (8/10), at a ratio of 1:4 for temperature control in a pulse-like manner.

Next, in step S5, the control device 100 controls the first temperature to a temperature changed according to the temperature change amount for each zone. In part (c-2-1) of FIG. 4, the first temperature (850° C.) is controlled to the temperatures of 852° C., 850° C., 848° C., and 846° C. changed according to the temperature change amount for each zone from “TOP” to “BTM.”

Furthermore, the control device 100 controls the first time with a value obtained by adding 1 to the minimum digit of the first temperature, and controls the second time with the first temperature. In part (c-2-2) of FIG. 4, the first time is controlled with a value (850.1° C.) obtained by adding 1 to the minimum digit (first decimal place) of the first temperature (850° C.), and the second time is controlled with the first temperature (850.0° C.). The ratio between the first time and the second time is 1:4. The control device 100 may control the first time with a value (852.1° C.) obtained by adding 1 to the minimum digit (first decimal place) of the temperature (e.g., 852° C. for “TOP”), which is changed according to the temperature change amount for each zone, and may control the second time with the changed temperature (852.0° C.).

In this way, in a case of the "TOP" zone where the target temperature is 850° C., to perform temperature control of 850.02° C. (adjusted with the temperature change amount), the temperature is controlled to 850.1° C. (or 852.1° C.) by a ratio of 2/10 and to 850.0° C. (or 852.0° C.) by a ratio of 8/10. This allows the temperature of the "TOP" zone to be controlled to an optimized temperature of 852.02° C. As a result, the temperature may be controlled to the digit (second decimal place in the example of FIG. 4) beyond the control limit value (first decimal place in the example of FIG. 4).

Next, in step S6, the control device 100 prepares the substrate by loading the substrate into a processing container and then performs film formation. The timing for preparing the substrate may occur before step S6.

Next, in Step S7, the control device 100 determines whether the film formation result meets a desired outcome. If the control device 100 determines that the film formation result meets the desired outcome, the control device 100 completes this processing. If the control device 100 determines that the film formation result does not meet the desired outcome, the process returns to step S1 and repeats the processing after step S1.

Effects

Figures 7A, 7B:
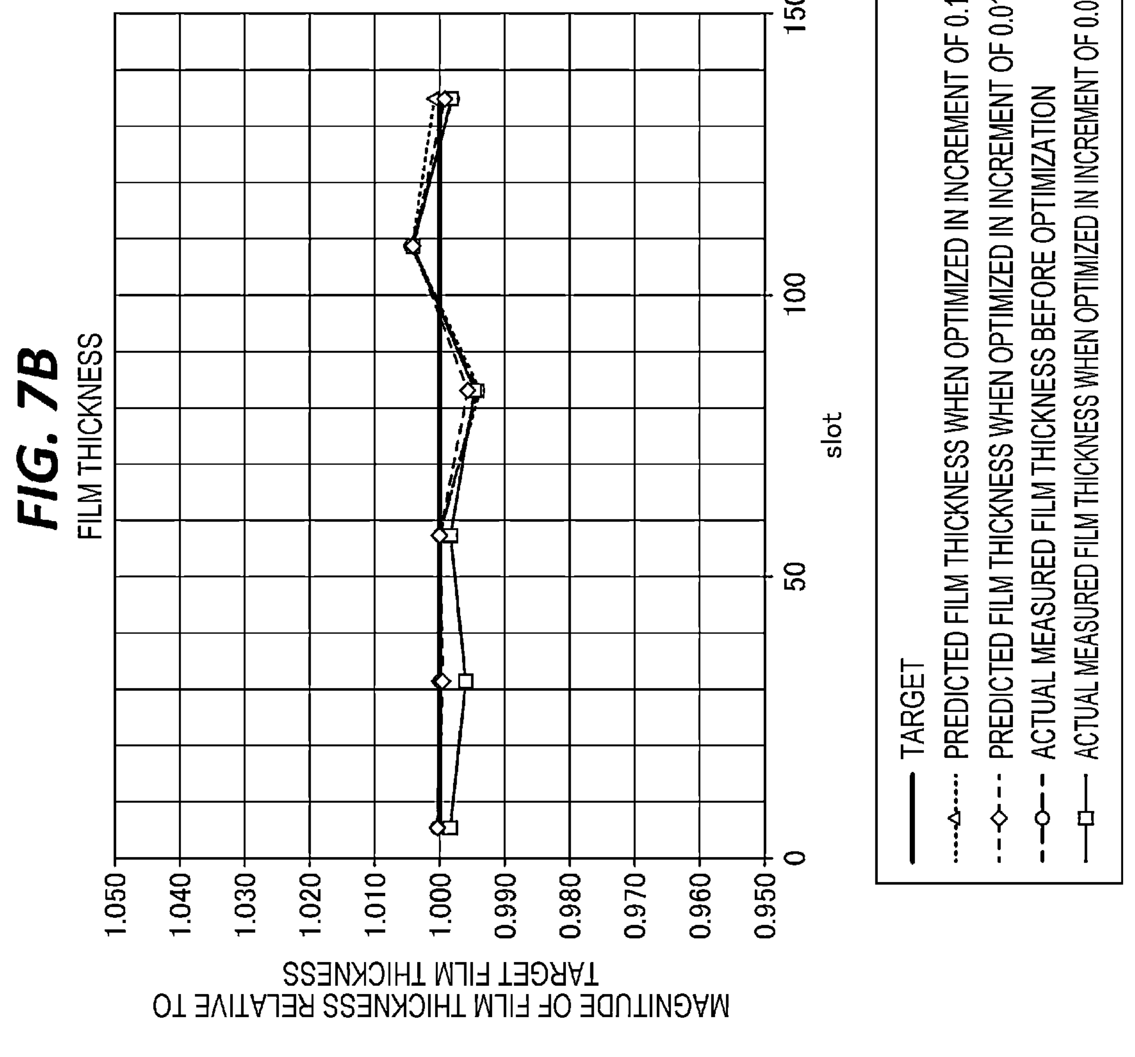
FIGS. 7A and 7B are diagrams illustrating an example of a predicted value and an actual measured value for a target film thickness according to an embodiment.

Referring to FIGS. 7A and 7B, an example of a predicted value (simulation result value) and an actual measured value (experimental result value) for a target film thickness according to an embodiment is described. FIGS. 7A and 7B are diagrams illustrating an example of a predicted value and an actual measured value, for a target film thickness according to an embodiment.

FIG. 7A illustrates the temperature change amount for each zone from "TOP" to "BTM," normalized with "TOP" set to "0.00," for the pre-optimization target temperature using the temperature control method according to the present embodiment. While the control limit value is in increments of 0.1° C., the temperature change amount is in increments of 0.01° C., due to the use of the temperature control method according to the present embodiment. In addition, it is also possible to control the temperature change amount in finer increments than 0.01° C. For example, when controlling to 500.012° C. in increments of 0.001° C., the film formation step is controlled at 500.0° C. by a ratio of 88/100 and at 500.1° C. by a ratio of 12/100.

When the temperature change amount is controlled in increments of 0.01° C., the inter-plane uniformity of the predicted value of the film thickness (predicted film thickness) predicted by simulations is 0.43%, which is better than the inter-plane uniformity of the actual measured value of the film thickness (actual measured film thickness), as measured before an optimization adjustment, which was 0.50%.

When the temperature change amount is controlled in increments of 0.01° C., the inter-plane uniformity of the actual measured value of the film thickness (actual measured film thickness) when performing film formation using the substrate processing apparatus 1 is 0.45%. The result is better than the inter-plane uniformity of the actual measured value of the film thickness (actual measured film thickness) measured before optimization adjustment, which was 0.50%.

The horizontal axis in FIG. 7B represents the slot number of the wafer boat 48. The slot is numbered sequentially from the top of "TOP." The vertical axis in FIG. 7B represents the magnitude of the film thickness relative to the target film thickness. The target film thickness is represented by the solid line, is set to 1, and is normalized.

The inter-plane uniformity of the predicted film thickness and the actual measured film thickness when optimized in increments of 0.01° C. was improved, when compared to the inter-plane uniformity of the actual measured film thickness before optimization. Further, the inter-plane uniformity of the predicted film thickness and the actual measured film thickness when optimized in increments of 0.01° C. was better than the inter-plane uniformity of the predicted film thickness, when optimized in increments of 0.1° C.

As described above, according to the temperature control method and the substrate processing apparatus of the present embodiments, it is possible to perform temperature control with finer precision than the control limit value of the heater in the substrate processing apparatus. Therefore, achieving temperature control with a finer temperature resolution typically improves the inter-plane uniformity of the film thickness more effectively than conventional temperature adjustment. This improves the inter-plane uniformity of the film thickness, thereby enhancing the yield. As a result, it is expected that the improved yield reduces substrate processing time and costs. Further, it may contribute to further miniaturization of semiconductors.

Further, according to the temperature control method of the present embodiments, it is possible to adjust the inter-plane uniformity of the film thickness with higher precision without requiring modifications to the hardware configuration of the substrate processing apparatus 1 (within the scope of normal operation). Further, in addition to the temperature change amount in increments of 0.1° C. using optimization software (optimization model), it is possible to calculate the temperature change timing suitable for any control digit. In addition, finer and more precise temperature control beyond the second decimal place is possible by subdividing increments of time (e.g., 1:99).

Although the above embodiments have been described with a focus on temperature control, similar precision exceeding the control limit of the substrate processing apparatus 1 may also be achieved in gas flow rate control and pressure control by performing the same gas flow rate control and pressure control as the above temperature control.

In the above embodiment, the substrate processing apparatus according to the present embodiments has been described as a batch type film forming apparatus that processes a plurality of substrates simultaneously, but is not limited thereto. The substrate processing apparatus according to the present embodiments may also be a single wafer type film forming apparatus that processes wafers individually, one by one. Further, the substrate processing apparatus may be a semi-batch type film forming apparatus that revolves, by a rotary table, a plurality of wafers placed on the rotary table inside a processing container, sequentially passing the wafers through regions where a first gas and a second gas are supplied. Further, the substrate processing apparatus may be a multi-wafer type film forming apparatus provided with a plurality of placement tables inside a single processing container.

According to an aspect, it is possible to perform temperature control with finer precision than the control limit value of a heater in a substrate processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A temperature control method comprising:

(a) providing a substrate processing apparatus including:

a processing container configured to accommodate a substrate; and a heater configured to heat an inside of the processing container;

(b) setting an amount of temperature change with respect to a target temperature, wherein the target temperature has a value measured to a second decimal place of lesser magnitude than a first decimal place indicating a control limit value of the heater;

(c1) dividing the amount of temperature change into a difference between a first temperature and a second temperature, said first temperature being greater than or equal to the target temperature and measured to the first decimal place, said second temperature being less than the target temperature and measured to the first decimal place, (c2) calculating a ratio by dividing the difference between the first temperature and the target temperature by the order of magnitude between the first and second decimal places, (c3) multiplying the ratio by a intended process time to obtain a first length of time where the heater is operated at the first temperature, and (c4) subtracting the first time from the intended process time to obtain a second length of time where the heater is operated at the second temperature; and (d) controlling the heater to either the first temperature or the second temperature according to the first and second lengths of time such that the heater is operated at the first temperature for the first length of time within the intended process time and such that the heater is operated at the second temperature for the second length of time within the intended process time.

2. The temperature control method according to claim 1, wherein the first temperature is obtained by adding 1 to the first decimal place of the second temperature.

3. The temperature control method according to claim 1, wherein the substrate processing apparatus further includes a boat configured to hold a plurality of substrates in a plurality of slots arranged vertically in multiple stages, the boat being loaded into and unloaded from the processing container, and wherein in (b) to (d), when dividing the plurality of slots into a plurality of zones, the amount of temperature change with respect to the target temperature is set for each zone, and the heater for each zone is independently controlled to operate the heater at the first or second temperature according to the ratio between the first and second lengths of time for each zone.

4. The temperature control method according to claim 1, wherein the first temperature is greater than the target temperature.

5. The temperature control method according to claim 1, further comprising:

(e) preparing the substrate in the processing container, and processing the substrate in the processing step.

6. A substrate processing apparatus comprising:

a processing container configured to accommodate a substrate;

a heater configured to heat an inside of the processing container; and a controller, wherein the controller controls a process including:

(a) setting an amount of temperature change with respect to a target temperature, wherein the target temperature has a value measured to a second decimal place of lesser magnitude than a first decimal place indicating a control limit value of the heater;

(b1) dividing the amount of temperature change into a difference between a first temperature and a second temperature, said first temperature being greater than or equal to the target temperature and measured to the first decimal place, said second temperature being less than the target temperature and measured to the first decimal place, (b2) calculating a ratio by dividing the difference between the first temperature and the target temperature by the order of magnitude between the first and second decimal places, (b3) multiplying the ratio by a intended process time to obtain a first length of time where the heater is operated at the first temperature, and (b4) subtracting the first time from the intended process time to obtain a second length of time where the heater is operated at the second temperature; and (c) controlling the heater to either the first temperature or the second temperature according to the first and second lengths of time such that the heater is operated at the first temperature for the first length of time within the intended process time and such that the heater is operated at the second temperature for the second length of time within the intended process time.

* * * * *